United States Patent
Fogel et al.

(10) Patent No.: US 6,846,727 B2
(45) Date of Patent: Jan. 25, 2005

(54) PATTERNED SOI BY OXYGEN IMPLANTATION AND ANNEALING

(75) Inventors: Keith E. Fogel, Mohegan Lake, NY (US); Mark C. Hakey, Fairfax, VT (US); Steven J. Holmes, Milton, VT (US); Devendra K. Sadana, Pleasantville, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 09/861,590

(22) Filed: May 21, 2001

(65) Prior Publication Data

US 2002/0173114 A1 Nov. 21, 2002

(51) Int. Cl.$^7$ .................. H01L 21/20; H01L 21/425; H01L 21/31
(52) U.S. Cl. .................. 438/479; 438/480; 438/527; 438/530; 438/766; 257/64; 257/66
(58) Field of Search .................. 438/479, 480, 438/527, 530, 766, 154, 165; 257/64, 66

(56) References Cited

U.S. PATENT DOCUMENTS

| | | |
|---|---|---|
| 4,749,660 A | 6/1988 | Short et al. |
| 4,786,608 A | 11/1988 | Griffith |
| 4,902,642 A | 2/1990 | Mao et al. |
| 4,975,126 A | 12/1990 | Margail et al. |
| 5,114,780 A * | 5/1992 | Mercer et al. .............. 428/195 |
| 5,279,978 A | 1/1994 | See et al. |
| 5,288,650 A | 2/1994 | Sandow |
| 5,374,566 A * | 12/1994 | Iranmanesh .................. 438/202 |
| 5,468,657 A * | 11/1995 | Hsu ............................. 438/766 |
| 5,514,897 A * | 5/1996 | Nakato ........................ 257/396 |
| 5,519,336 A | 5/1996 | Liu et al. |
| 5,589,407 A | 12/1996 | Meyappan et al. |
| 5,930,643 A | 7/1999 | Sadana et al. |
| 6,043,166 A | 3/2000 | Roitman et al. |
| 6,066,554 A * | 5/2000 | Kim et al. .................... 438/627 |
| 6,074,929 A * | 6/2000 | Thomas ........................ 438/407 |
| 6,090,689 A | 7/2000 | Sadana et al. |
| 6,221,743 B1 * | 4/2001 | Fujikawa et al. ........... 438/530 |
| 6,222,253 B1 * | 4/2001 | Sadana et al. .............. 257/617 |
| 6,248,642 B1 * | 6/2001 | Dolan et al. ................. 438/407 |
| 6,258,693 B1 * | 7/2001 | Choi ........................... 438/423 |
| 6,259,137 B1 * | 7/2001 | Sadana et al. .............. 257/347 |
| 6,265,248 B1 * | 7/2001 | Darmawan et al. ......... 438/155 |
| 6,387,741 B1 * | 5/2002 | Kawano ...................... 438/165 |
| 6,417,078 B1 * | 7/2002 | Dolan et al. ................. 438/480 |

FOREIGN PATENT DOCUMENTS

JP      63 217657      9/1988

OTHER PUBLICATIONS

Wolf, S., "Silicon Processing for the VLSI Era", vol. 2: Process Integration, 1990, pp. 72–73.

* cited by examiner

*Primary Examiner*—Long Pham
*Assistant Examiner*—Shrinivas H. Rao
(74) *Attorney, Agent, or Firm*—Scully, Scott, Murphy & Presser; Robert M. Trepp, Esq.

(57) ABSTRACT

Methods for forming a patterned SOI region in a Si-containing substrate are provided which has geometries of about 0.25 $\mu$m or less. The methods disclose each utilize a patterned dielectric mask that includes at least one opening having a size of about 0.25 $\mu$m or less which exposes a portion of a Si-containing substrate. Oxygen ions are implanted through the opening using at least a base ion implantation process which is carried out at an oxygen beam energy of about 120 keV or less and an oxygen dosage of about 4E17 cm$^{-2}$ or less. These conditions minimize erosion of the vertical edges of the patterned dielectric mask and minimize formation of lateral straggles.

28 Claims, 5 Drawing Sheets

PATTERNED SOI BY OXYGEN IMPLANTATION AND ANNEALING

CROSS RELATED APPLICATIONS

This application is related to co-assigned U.S. application Ser. No. 09/861,593, filed on May 21, 2001, now U.S. Pat. No. 6,486,037; co-assigned U.S. application Ser. No. 09/861,594, filed May 21, 2001; co-assigned U.S. application Ser. No. 09/861,596, filed May 21, 2001, the entire contents of each of which is incorporated herein by reference.

FIELD OF THE INVENTION

The present invention relates to silicon-on-insulator (SOI) substrates for use in the semiconductor industry for fabricating integrated circuits (ICs), and more particularly to a method of forming highly uniform patterned SOI regions within a Si-containing substrate including a preformed SOI substrate, that has geometries of less than about 0.25 $\mu$m. SOI-containing substrates may contain a single or multiple buried oxide (BOX) regions in blanket or patterned fashion. High quality buried oxide (BOX) regions are also formed in the present invention.

BACKGROUND OF THE INVENTION

Separation by implantation of oxygen (SIMOX) is a technique used in the semiconductor industry in fabricating SOI substrates that can be used in the manufacturing of ICs. SIMOX typically involves using high-energy ions to implant a large dose of oxygen ions beneath the surface of a bulk Si-containing wafer. Upon high-temperature annealing, the implanted oxygen ions form a continuous BOX region which electrically isolates the Si at the surface (i.e., superficial Si layer). Typically, prior art SIMOX processes have been used to fabricate SOIs with a superficial Si layer and a BOX thickness of several thousand angstroms.

In some applications, it is desirable to form discrete and isolated BOX regions within a Si-containing substrate while not forming a BOX region in other portions of the Si-containing substrate. Hence, there is a growing need for providing such patterned SOI regions. Patterned SOT regions formed within a Si-containing substrate are especially needed for future high performance Si-containing ICs, optical communication devices and three-dimensional device and circuit integration.

Despite this need, there are many challenges in fabricating patterned SOI regions within a Si or SOI-containing substrate. For example, the following criteria needs to be met:

(i) maintaining a smooth surface topology between the patterned and unpatterned regions;

(ii) controlling and eliminating crystallographic defects at the edge of the mask used during ion implantation to create patterned regions; and (iii) controlling and eliminating crystal defects between the nearby oxide islands.

The inventors are not aware of any prior art method which meets the above-mentioned criteria. Hence, there is a need for providing a method which is capable of forming at least one patterned SOI region within a Si-containing or SOI-containing substrate which meets the above-mentioned criteria.

SUMMARY OF THE INVENTION

One object of the present invention is to provide a method of forming at least one patterned SOI region within a Si-containing or SOI-containing substrate.

Another object of the present invention is to provide a method of forming at least one patterned SOI region within a Si-containing or SOI-containing substrate which maintains a substantially smooth surface topology between the patterned and unpatterned regions.

A further object of the present invention is to provide a method of forming at least one patterned SOI region within a Si-containing or SOI-containing substrate wherein the method essentially controls and substantially eliminates crystallographic defects at the edge of the mask used during the ion implantation to create the patterned regions.

A yet further object of the present invention is to provide a method of forming at least one patterned SOI region within a Si-containing or SOI-containing substrate wherein the method essentially controls and eliminates crystal defects between the nearby oxide islands, i.e., between the discrete buried oxide (BOX) regions.

An even further object of the present invention is to provide a method of forming at least one highly uniform sub-0.25 $\mu$m patterned SOI region within a Si-containing or SOI-containing substrate.

These and other objects and advantages are achieved in the present invention by utilizing a SIMOX process that includes the steps of:

(a) forming a patterned dielectric mask on a surface of a Si-containing substrate, wherein said patterned dielectric mask includes vertical or inclined edges that define boundaries for at least one opening which exposes a portion of said Si-containing substrate;

(b) implanting oxygen ions through said at least one opening using oxygen implant conditions that minimize erosion of the vertical or inclined edges of the patterned dielectric mask and minimize formation of a lateral straggle under the vertical or inclined edges of said patterned dielectric mask;

(c) removing said patterned dielectric mask;

(d) forming a Si-containing layer on said surface of said Si-containing substrate; and (e) annealing said Si-containing substrate at a temperature of about 1250° C. or above and in an oxidizing ambient so as to form at least one discrete buried oxide region in said Si-containing substrate.

Note that the term Si-containing substrate includes SOI substrates that may contain single or multiple layers of buried oxide regions, or Si-containing SOI, for example, SiGe on SOI, in unpatterned or patterned forms.

In accordance with the present invention, the implant step, i.e., step (b), is carried out with a very low oxygen energy beam (on the order of about 120 keV or less) and at relatively low doses (on the order of about $4 \times 10^{17}$ cm$^{-2}$ or less).

In one embodiment of the present invention, the patterned dielectric mask is not removed in step (c) and no Si-containing layer is deposited as described in (d). Instead, in this alternative embodiment of the present invention, the patterned dielectric mask remains on the surface of the substrate throughout the process, and the Si-containing layer is formed only in the exposed portions of the Si-containing substrate.

Another aspect of the present invention relates to patterned SOI substrates that are formed by employing the method of the present invention. Specifically, the patterned SOI substrate comprises a Si-containing substrate having at least one discrete buried oxide region formed therein, wherein said at least one buried oxide region electrically isolates a superficial Si-containing layer from a bottom Si-containing layer.

The discrete buried oxide (BOX) regions of the present invention exhibit high structural as well as electrical qualities as compared to buried oxide regions formed using conventional SIMOX processes. The BOX regions can contain crystallographic facets bounded by major crystallographic planes, such as (110), (111) or others.

The term "high structural quality" is used herein to denote a SOI substrate which has little or no etch pitch density (less than about 1E5 $cm^2$); little or no top or bottom Si/buried oxide roughness (surface roughness of less than about 200 Å as measured by TEM (transmission electron microscopy) or scanning electron microsopy (SEM).

The term "high electrical quality" is used herein to denote a structure wherein the buried oxide breakdown field on a unpatterned SOI substrate is high (greater than about 4 megavolts per cm); the buried oxide minibreakdown in an unpatterned substrate is voltage is greater than about 30 volts; the buried oxide leakage at a given voltage is low (less than about 1 nanoAmp); and the buried oxide density is low (less than about 1 $cm^{-2}$).

DETAILED DESCRIPTION OF THE INVENTION

The present invention which relates to a method for providing a highly uniform sub-0.25 µm patterned SOI substrate containing discrete buried oxide regions will now be described in greater detail by referring to the drawings that accompany the present application. It is noted that like and/or corresponding elements in the drawings are referred to by like reference numerals.

Figure 1A:
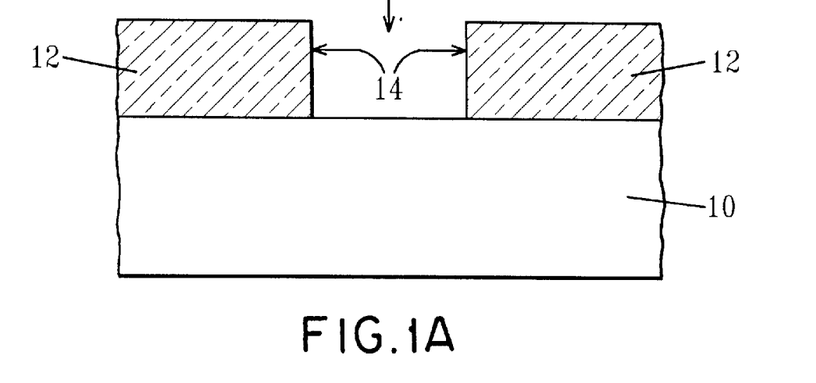
FIGS. 1A–1D are pictorial representations (through cross-sectional views) of the inventive patterned SOI substrate through various processing steps of the present invention.

Reference is first made to FIGS. 1A–1D which show cross-sectional views of the inventive patterned SOI substrate through various processing steps of the present invention. Specifically, FIG. 1A provides an illustration of an initial structure of the present invention. The initial structure shown in FIG. 1A comprises Si-containing substrate 10 having patterned dielectric mask 12 formed on a surface thereof. In accordance with the present invention, patterned dielectric mask 12 includes vertical or inclined edges 14 that define boundaries for at least one opening 16 which exposes a portion of the Si-containing substrate. It should be noted that although FIG. 1A shows only a single opening formed in the patterned dielectric mask, the present invention works in cases wherein more than one opening is formed in the patterned dielectric mask. FIG. 2A, for example, shows an example wherein two openings are present in the patterned dielectric mask.

The initial structure shown in FIG. 1A is formed using conventional materials well known to those skilled in the art and conventional processes are also employed in forming the same. For example, Si-containing substrate 10 includes, but is not limited to: Si, SiGe, Si/Si, Si/SiC and Si/SiGe. In one preferred embodiment of the present invention, the Si-containing substrate is composed of a Si wafer. The Si-containing substrate employed in the present invention may be undoped or doped (p or n-type) with or without an epitaxial-Si layer of n or p-type, or undoped depending on the future use of the SOI substrate. In some applications the starting Si-containing substrate may be a preformed SOI-containing substrate which includes single or multiple buried oxide layers or Si-containing SOI, (for example, SiGe on SOI), in unpatterned or patterned forms.

Next, a dielectric material such as an oxide, nitride, oxynitride or combinations and multilayers thereof is formed on the surface of the Si-containing substrate. The dielectric material, which serves as the ion implantation mask, is formed using conventional deposition processes that are well known in the art. For example, the dielectric material may be formed by chemical vapor deposition (CVD), plasma-enhanced CVD, sputtering, evaporation, chemical solution deposition, and other like deposition processes. Alternatively, the dielectric material may be formed by a conventional thermal oxidation, nitridation or oxynitridation process.

The thickness of the dielectric material formed on the Si-containing substrate may vary depending on the material as well as method used. Typically, however, the dielectric material has a thickness of from about 1000 to about 20,000 Å, with a thickness of from about 4000 to about 12000 Å being more highly preferred.

After forming the dielectric material on the surface of the Si-containing substrate, the dielectric material is patterned using conventional lithography and etching. The lithography step includes: depositing a conventional photoresist (not shown) onto the dielectric material, exposing the deposited photoresist with a pattern of radiation and developing the pattern. The etching step used in forming patterned dielectric mask 12 includes a conventional dry or wet etch process that has a high selectivity for removing dielectric as compared with the Si-containing substrate. It is noted that the patterned photoresist is stripped after the etching step.

The size of the at least one opening which is defined by vertical or inclined edges of the patterned dielectric mask may vary depending on the desired device to be fabricated in the Si-containing substrate. Typically, however, the size of the least one opening is about 0.25 µm or less, with a size of from about 0.01 to about 10 µm being more highly preferred.

Figure 1B:
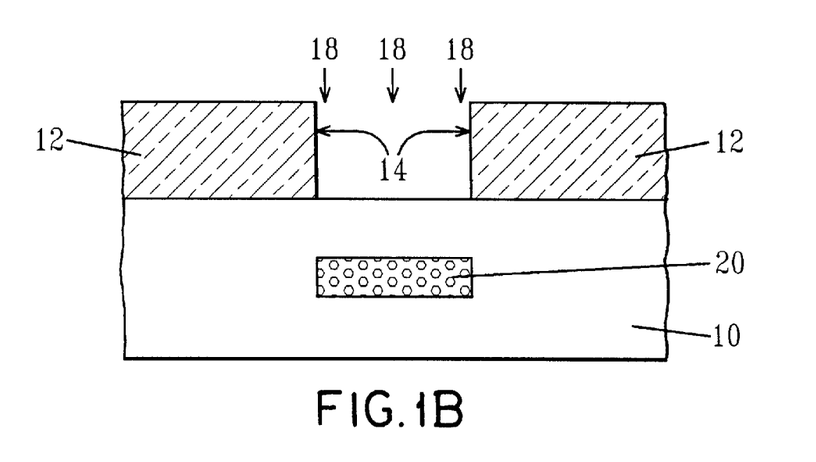
Figure 2A:
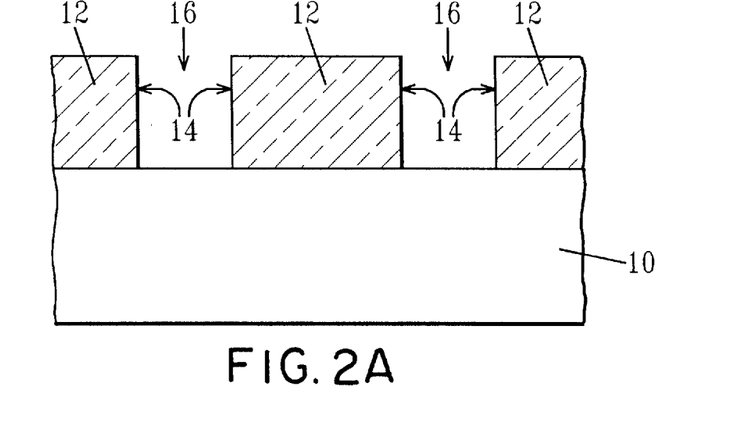
FIGS. 2A–2D are pictorial representations (through cross-sectional views) of the inventive patterned SOI substrate through various processing steps of an alternative embodiment of the present invention.

Next, and as shown in FIG. 1B, the structure of FIG. 1A is subjected to an oxygen ion implant step which employs oxygen implant conditions that minimize erosion of the vertical or inclined edges of the patterned dielectric mask and minimize formation of a lateral straggle under the vertical or inclined edges of the patterned dielectric mask. This oxygen ion implant step which forms a region of oxygen ions (this region is referred to by reference numeral 20 in FIG. 1B) in the Si-containing substrate is shown, for example, in FIG. 1B. Note that the oxygen ions implant which is represented by reference numeral 18 occurs through the at least one opening using the patterned dielectric as an implantation mask.

In accordance with the present invention, minimized erosion of the vertical or inclined edges of the patterned dielectric mask and minimized formation of a lateral straggle under the vertical or inclined edges of the patterned dielectric mask can be obtained by employing a very low oxygen energy beam (on the order of about 120 keV or less) and at relatively low doses (on the order of about 4E17 cm$^{-2}$ or less). More specifically, the oxygen ion implantation step employed in the present invention is carried out using an energy beam of from about 20 to about 70 keV and at an oxygen dose of from about 2E16 to about 2.5E17 cm$^{-2}$. The lateral straggle in the present invention is less than 0.25 $\mu$m. More specifically, lateral straggle is in the range 0.05 to 0.2 $\mu$m. Lateral straggle is defined as the distance at which implanted oxygen stops beyond the edge of the mask.

This implant, which may be referred to as a base ion implant, is carried out at a temperature of from about 100° to about 800° C. at a beam current density of from about 0.05 to about 50 mA cm$^{-2}$. More preferably, the base ion implant may be carried out at a temperature of from about 500° to about 750° C. at a beam current density of from about 10 to about 20 mA cm$^{-2}$.

If desired, the base oxygen implant step may be followed by a second oxygen implant that is carried out using an oxygen dose of from about 1E14 to about 1E16 cm$^{-2}$, with an oxygen dose of from about 1E14 to about 1E15 cm$^{-2}$ being more highly preferred. The second oxygen implant is carried out at an energy of from about 20 to about 120 keV, with an energy of from about 20 to about 70 keV being more preferred.

This second implant is performed at a temperature of from about 4K to about 200° C. with a beam current density of from about 0.05 to about 10 mA cm$^{-2}$. More preferably, the second oxygen implant may be performed at a temperature of from about 25° to about 100° C. with a beam current density of from about 0.5 to about 5 mA cm$^{-2}$.

Note that the second oxygen implant forms an amorphous region below the damaged region caused by the base ion implant step. During subsequent annealing, the amorphous and damaged regions are converted into a BOX region. For clarity, region 20 is employed in the present invention for both the amorphous and damaged regions.

Following the implanting of oxygen ions, the patterned dielectric mask may be removed from the surface of the Si-containing substrate and thereafter a layer of Si-containing material 22 is formed on the surface of the Si-containing substrate. The removal step includes the use of any conventional stripping process that has a high selectivity for removing dielectric material as compared to Si. For example, HF or reactive ion etching may be employed in the present invention for removing patterned dielectric mask 12 from the structure.

The Si-containing material employed in the present invention includes amorphous Si, polycrystalline Si (i.e., poly-Si), epitaxial Si (i.e., epi-Si), SiGe, SiC, or any combinations and multilayers thereof. The resultant structure after removing the patterned dielectric mask and formation of Si-containing layer 22 is shown, for example, in FIG. 1C.

The Si-containing layer is formed on the surface of the Si-containing substrate using conventional deposition processes well known to those skilled in the art. For example, Si-containing layer 22 may be formed by chemical vapor deposition (CVD), plasma-enhanced chemical vapor deposition (PECVD), low-pressure chemical vapor deposition (LPCVD), sputtering, evaporation and chemical solution deposition. Alternatively, layer 22 may be formed by using a conventional epitaxial growth method.

The thickness of the Si-containing layer formed on the Si-containing substrate may vary depending upon the required thickness necessary to achieve the formation of a BOX region having the above-mentioned properties. Typically, in the present invention, Si-containing layer 22 has a thickness of from about 100 to about 50000 Å, with a thickness of from about 500 to about 5000 Å being more preferred.

Figure 1C:
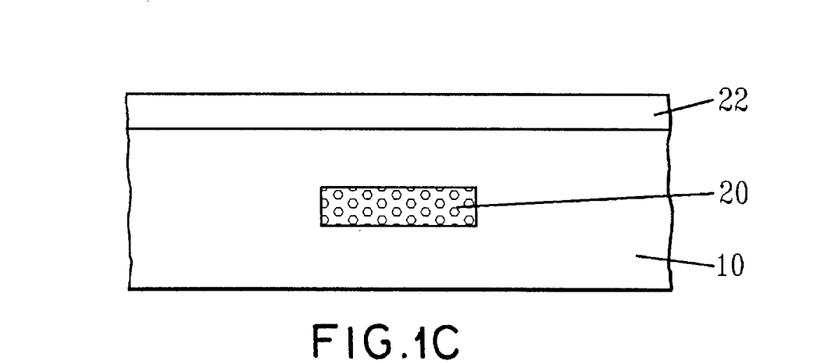

Following formation of the Si-containing on the surface of the Si-containing substrate, the structure shown in FIG. 1C is then subjected to high-temperature annealing which is carried out at a temperature of about 1250° C. or above and in an oxidizing ambient so as to form at least one discrete buried oxide region 24 in said Si-containing substrate. More specifically, the high-temperature annealing is carried out at a temperature of from about 1300° to about 1350° C.

The time period in which annealing is preformed may vary, but typically it is from about 1 to about 100 hours, with an annealing time period of from about 2 to about 24 hours being more highly preferred.

In accordance with the present invention, annealing is carried out in an oxidizing ambient that includes from about 0.1 to about 100% oxygen and from about 99.9 to about 0% inert gas such as He, Ar, and N$_2$. In one preferred embodiment of the present invention, Ar is employed as the inert gas. More preferably, the annealing step employed in the present invention is carried out in an ambient that includes from about 0.1 to about 50% oxygen and from about 50 to about 99.9% inert gas.

The annealing step may be carried out by simply heating the substrate at a specific temperature ramp rate to the targeted temperature, or various ramp and soak cycles may be employed. During the various ramp and soak cycles it is possible to vary the content of the annealing ambient within the ranges mentioned above. The parameters for the ramp and soak cycles are mentioned in U.S. Pat. No. 5,930,643 to Sadana, et al, the entire content of which is incorporated herein by reference. Note that the parameters for the ramp and soak cycles in the '643 patent may be adjusted herein to achieved formation of the inventive SOI substrate. For example, a ramp rate (heating and cooling) of from about 0.1° C./min to about 10° C./min may be employed.

Figure 1D:
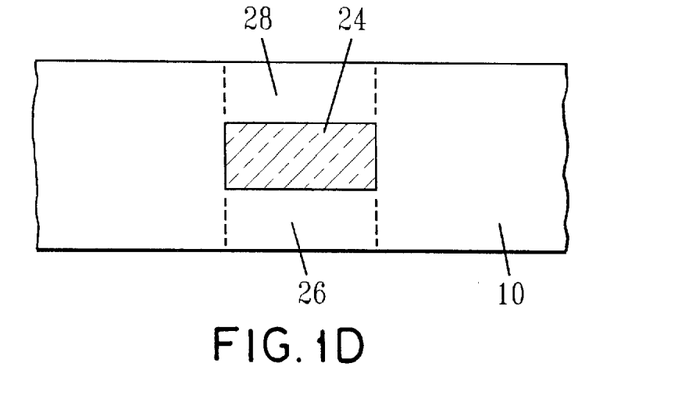

The structure that is formed after annealing is shown in FIG. 1D. Note that BOX region 24 electrically isolates superficial Si-containing layer 28 from bottom Si-containing layer 26. The dotted lines are employed to represents the boundaries of these two Si-containing layers. It should be also noted that during the annealing step a surface oxide forms on the surface of the Si-containing substrate. The surface oxide is not shown in the drawings since it is typically removed after annealing using a chemical wet etch process that has a high selectivity for removing oxide as compared with Si.

The thickness of the BOX regions formed in the present invention may vary depending upon the exact embodiment used in fabricating the same. Typically, however, the BOX region of the present invention has a thickness of from about 100 to about 2000 Å, with a thickness of from about 500 to about 1500 Å being more highly preferred. Note that the BOX thickness is a mean value that is based upon a Gaussian distribution curve.

Insofar as the top superficial Si-containing layer is concerned, that Si-containing layer may have a variable thickness which is also dependent upon the exact embodiment used in fabricating the same. Typically, however, the superficial Si-containing layer of the SOI substrate of the present invention has a thickness of from about 100 to about 50000 Å, with a thickness of from about 100 to about 2000

Å being more highly preferred. The thickness of the bottom Si layer is inconsequential to the present invention.

In an alternative embodiment which is shown, for example, in FIGS. 2A–2D, the patterned dielectric mask remains on the structure throughout the entire process. Specifically, this alternative embodiment includes the use of the initial structure shown in FIG. 2A. Note that this structure is identical to the one shown in FIG. 1A except that patterned dielectric mask 12 contains two openings.

Figure 2B:
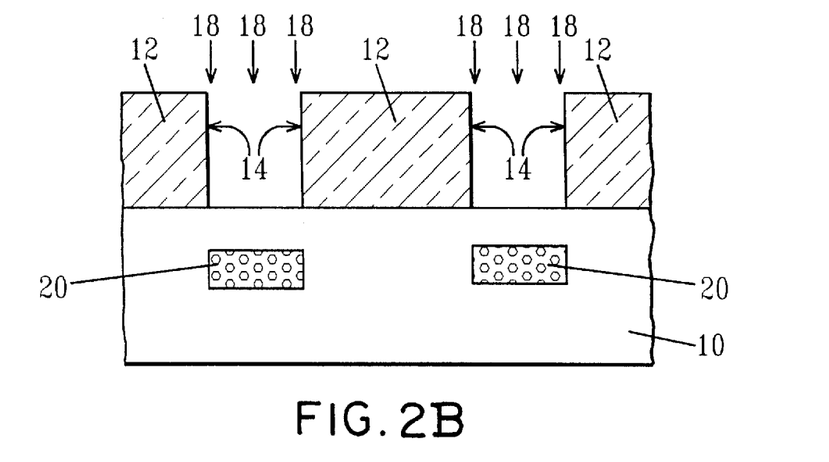

As is the case with the previously discussed embodiment of the present invention, the structure shown in FIG. 2A is subjected to oxygen ion implantation using the above-mentioned conditions. The resultant structure is shown in FIG. 2B.

Figure 2C:
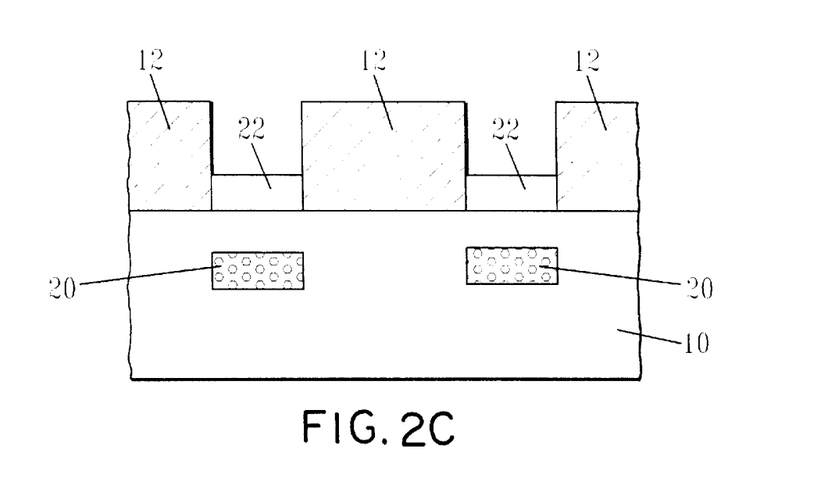

Next, and as shown in FIG. 2C, Si-containing layer 22 is formed only on the exposed portions of the Si-containing substrate. Note that in this alternative embodiment of the present invention the patterned dielectric mask is not removed during the formation of Si-containing layer 22.

Figure 2D:
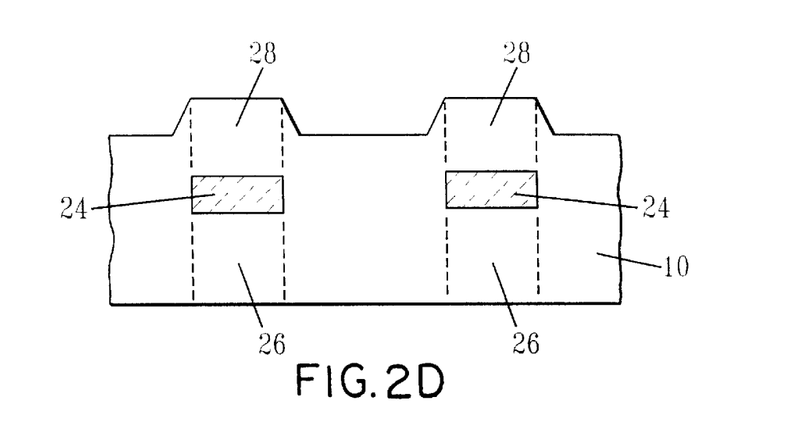

After forming the Si-containing layer in the openings, the structure shown in FIG. 2C is then subjected to the above-mentioned annealing step and thereafter the patterned dielectric is removed as previously discussed forming the structure shown in FIG. 2D. Note that in this structure the superficial Si layer of the SOI region extends above the top surface of the Si-containing substrate.

In yet another embodiment of the present invention, the process steps mentioned above in regard to FIGS. 2A–2D are employed except that no Si-containing layer is formed in the openings. The resultant structure obtained from this embodiment is shown, for example, in FIG. 3.

Figure 3:
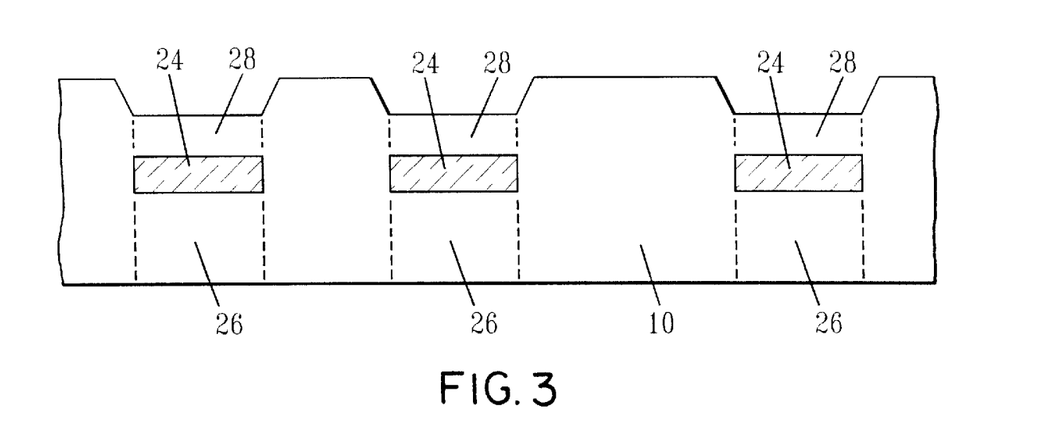
FIG. 3 is a pictorial representation (through a cross-sectional view) of an alternative SOI structure of the present invention.

In a further embodiment, the dielectric mask is not removed after the above described implantation step(s). Subsequent high temperature annealing, mask removal and Si-containing layer deposition produces a structure similar to that which is shown in FIG. 3.

Note that the above processing steps may be repeated any number of times, as desired, to produce a patterned SOI substrate which includes various BOX regions formed atop of a Si-containing region. In all cases mentioned above, an epi-Si layer may be formed upon the superficial Si-containing layer.

Figure 4:
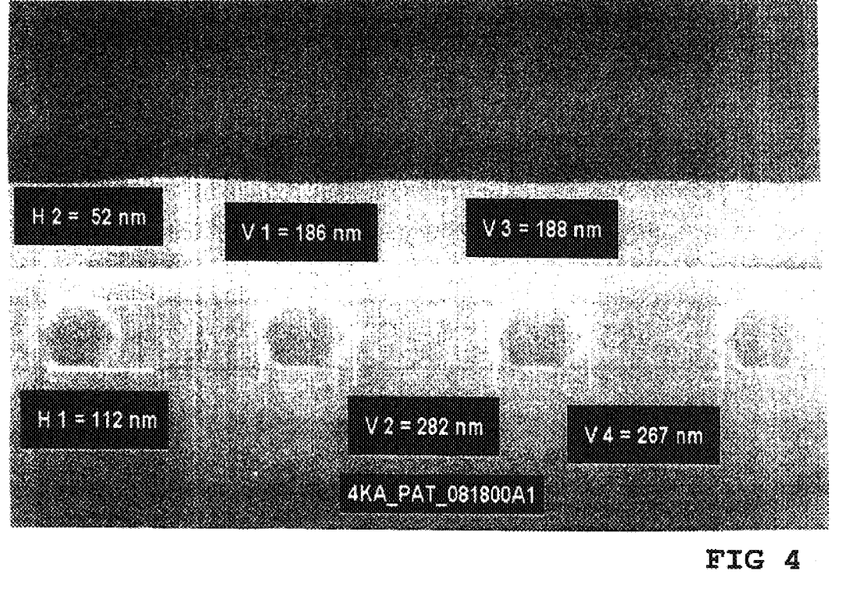
FIG. 4 is a cross-sectional view via TEM (transmission electron microscopy) of the inventive patterned SOI substrate.
Figure 5:
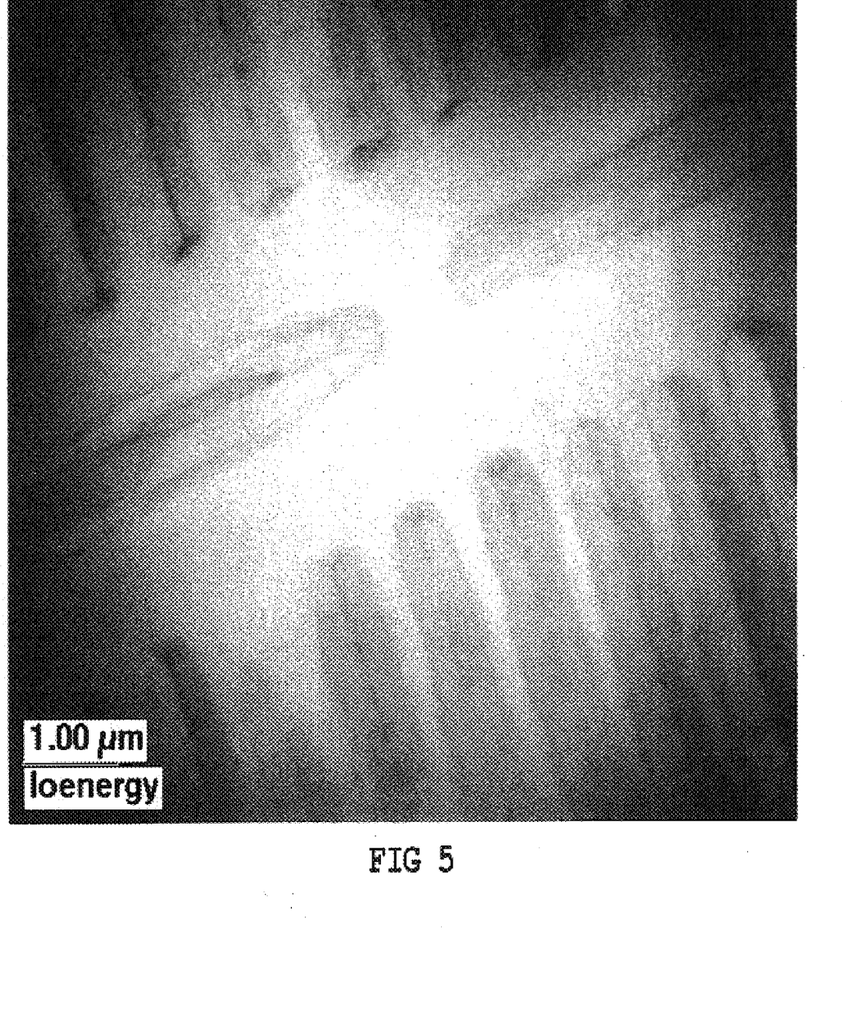
FIG. 5 is a top-down view via TEM of the inventive patterned SOI substrate.

Some SEMs and TEMs of the inventive SOI substrates are shown, for example, in FIGS. 4–5. Note that in these TEMs and SEMs the first embodiment described above is employed in forming these SOI substrates. FIG. 4 is a cross-sectional SEM micrograph showing discrete buried oxide regions separated by Si or Si-containing regions. The surface of the substrate is relatively smooth despite the presence of buried oxide regions. Also, the edges of the buried oxide islands have facets which correspond to well known crystallographic planes, such as {111}, {311}, {110} etc.

The patterned SOI substrate (i.e., patterned SOI region within a Si-containing substrate) shown in the accompanying drawings can be used in forming high-performance semiconductor devices or circuits. Examples of such devices or circuits that can contain the SOI substrate of the present invention include, but are not limited to: microprocessors, memory cells such as dynamic random access memory (DRAM) or static random access memory (SRAM), embedded DRAMs, application specific integrated circuits (ASICs) and larger and more complicated structures. Since these devices or circuits are well known in the art, it is not necessary to provide a detail description concerning the same. It is however emphasized that the active devices and/or circuits are typically formed in the top superficial Si layer of the SOI substrate. In addition to being used in the above manner, the inventive SOI substrates may be used in optical communication devices and three-dimensional device and circuit integration.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a patterned SOI region within a Si-containing substrate, said method comprising the steps of:
   (a) forming a patterned dielectric mask on a surface of a Si-containing substrate, wherein said patterned dielectric mask includes vertical edges that define boundaries for at least one opening having a size of about 0.25 µm or less which exposes a portion of said Si-containing substrate, said patterned dielectric mask serving as an ion implantation mask;
   (b) implanting oxygen ions through said at least one opening using at least a base ion implantation process which is carried out at an oxygen beam energy of about 120 keV or less and an oxygen dosage of about 4E17 $cm^{-2}$ or less, wherein said oxygen implant conditions minimize erosion of the vertical edges of the patterned dielectric mask and minimize formation of a lateral straggle under the vertical edges of said patterned dielectric mask;
   (c) removing said patterned dielectric mask;
   (d) forming a Si-containing layer on said surface of said Si-containing substrate; and
   (e) annealing said Si-containing substrate at a temperature of about 1250° C. or above and in an oxidizing ambient so as to form at least one discrete buried oxide region in said Si-containing substrate.

2. The method of claim 1 wherein said Si-containing substrate is composed of Si, SiGe, Si/Si, Si/SiGe or Si/SiC.

3. The method of claim 2 wherein said Si-containing substrate is composed of a single layered or multilayered silicon-on-insulator (SOI) or Si-containing SOI in unpatterned or patterned forms.

4. The method of claim 1 wherein said patterned dielectric mask is composed of an oxide, a nitride, an oxynitride or combinations and multilayers thereof.

5. The method of claim 1 wherein said patterned dielectric mask is formed by the steps of: forming a dielectric material on said surface of said Si-containing substrate; applying a photoresist to said dielectric material; exposing said photoresist to a pattern of radiation; developing the patterned photoresist and etching the pattern into said dielectric material.

6. The method of claim 1 wherein said at least one opening has a size of from about 0.01 to about 0.10 µm.

7. The method of claim 1 wherein said oxygen beam energy is from about 20 to about 70 keV.

8. The method of claim 1 wherein said oxygen dosage is from about 2E16 to about 2.5E17 $cm^{-2}$.

9. The method of claim 1 wherein step (b) is performed at a temperature of from about 100° to about 800° C. at a beam current density of from about 10 to about 50 mA $cm^{-2}$.

10. The method of claim 9 wherein step (b) is performed at a temperature of from about 500° to about 750° C. at a beam current density of from about 0.05 to about 20 mA cm$^{-2}$.

11. The method of claim 1 further comprising a second oxygen ion implantation step which follows immediately after the base ion implantation process.

12. The method of claim 11 wherein said second oxygen ion implantation step is carried out using an oxygen dosage of from about 1E14 to about 1E16 cm$^{-2}$ and at an energy of from about 20 to about 120 keV.

13. The method of claim 12 wherein said second oxygen ion implantation step is carried out using an oxygen dosage of from about 1E14 to about 1E15 cm$^{-2}$ and at an energy of from about 20 to about 70 keV.

14. The method of claim 11 wherein said second oxygen ion implantation step is performed at a temperature of from about 4K to about 200° C. at a beam current density of from about 0.05 to about 10 mA cm$^{-2}$.

15. The method of claim 14 wherein said second oxygen ion implantation step is performed at a temperature of from about 25° to about 100° C. at a beam current of from about 0.5 to about 5 mA cm$^{-2}$.

16. The method of claim 1 wherein said Si-containing layer comprises amorphous Si, polySi, epi-Si, SiGe, SiC or combinations and multilayers thereof.

17. The method of claim 1 wherein said Si-containing layer has a thickness of from about 100 to about 50000 Å.

18. The method of claim 17 wherein said Si-containing layer has a thickness of from about 500 to about 5000 Å.

19. The method of claim 1 wherein said annealing is carried out at a temperature of from about 1300° to about 1350° C.

20. The method of claim 1 wherein said annealing is carried out for a time period of from about 1 to about 100 hours.

21. The method of claim 20 wherein said annealing is carried out for a time period of from about 2 to about 24 hours.

22. The method of claim 1 wherein said oxidizing ambient comprises from about 0.1 to about 100% oxygen and from about 99.9 to about 0% inert gas.

23. The method of claim 22 wherein said oxidizing ambient comprises from about 0.1 to about 50% oxygen and from about 50 to about 99.9% inert gas.

24. The method of claim 22 wherein said inert gas comprises He, Ar or $N_2$.

25. The method of claim 1 wherein said annealing is carried out using a ramp and soaking heating and cooling regime.

26. A method of fabricating a patterned SOI substrate having fine geometries, said method comprising the steps of:

(a) forming a patterned dielectric mask on a surface of a Si-containing substrate, wherein said patterned dielectric mask includes vertical edges that define boundaries for at least one opening having a size of about 0.25 μm or less which exposes a portion of said Si-containing substrate, said patterned dielectric mask serving as an ion implantation mask;

(b) implanting oxygen ions through said at least one opening using at least a base ion implantation process which is carried out at an oxygen beam energy of about 120 keV or less and an oxygen dosage of about 4E17 cm$^{-2}$ or less, wherein said oxygen implant conditions minimize erosion of the vertical edges of the patterned dielectric mask and minimize formation of a lateral straggle under the vertical edges of said patterned dielectric mask; and (c) annealing said Si-containing substrate at a temperature of about 1250° C. or above and in an oxidizing ambient so as to form at least one discrete buried oxide region in said Si-containing substrate.

27. The method of claim 26 further comprising forming a Si-containing layer on said exposed portion of said Si-containing substrate between steps (b) and (c).

28. A method of fabricating a patterned SOI substrate having fine geometries, said method comprising the steps of:

(a) forming a patterned dielectric mask on a surface of a Si-containing substrate, wherein said patterned dielectric mask includes vertical edges that define boundaries for at least one opening having a size of about 0.25 μm or less which exposes a portion of said Si-containing substrate, said patterned dielectric mask serving as an ion implantation mask;

(b) implanting oxygen ions through said at least one opening using at least a base ion implantation process which is carried out at an oxygen beam energy of about 120 keV or less and an oxygen dosage of about 4E17 cm$^{-2}$ or less, wherein said oxygen implant conditions minimize erosion of the vertical edges of the patterned dielectric mask and minimize formation of a lateral straggle under the vertical edges of said patterned dielectric mask;

(c) annealing said Si-containing substrate at a temperature of about 1250° C. or above and in an oxidizing ambient so as to form at least one discrete buried oxide region in said Si-containing substrate; and (d) removing said patterned dielectric mask and forming a Si-containing layer on said exposed portion of said Si-containing substrate.

\* \* \* \* \*